(12) United States Patent
Tsukihara et al.

(10) Patent No.: US 7,718,980 B2
(45) Date of Patent: May 18, 2010

(54) BEAM PROCESSING SYSTEM AND BEAM PROCESSING METHOD

(75) Inventors: Mitsukuni Tsukihara, Ehime (JP); Mitsuaki Kabasawa, Ehime (JP)

(73) Assignee: SEN Corporation, Tokyo (JP)

( * ) Notice: Subject to any disclaimer, the term of this patent is extended or adjusted under 35 U.S.C. 154(b) by 159 days.

(21) Appl. No.: 11/806,128

(22) Filed: May 30, 2007

(65) Prior Publication Data

US 2008/0067397 A1   Mar. 20, 2008

(30) Foreign Application Priority Data

May 30, 2006   (JP) .............................. 2006-150103

(51) Int. Cl.
  *H01J 37/30*   (2006.01)
(52) U.S. Cl. .............................. 250/492.21; 250/396 R
(58) Field of Classification Search ............ 250/492.21, 250/396 R
  See application file for complete search history.

(56) References Cited

U.S. PATENT DOCUMENTS 7,351,987 B2 *   4/2008   Kabasawa et al. ...... 250/492.21

7,361,892 B2 *   4/2008   Kabasawa et al. ............ 250/290
7,429,743 B2 *   9/2008   Kabasawa et al. ...... 250/492.21

FOREIGN PATENT DOCUMENTS

JP   2003-288857 A   10/2003

\* cited by examiner

*Primary Examiner*—Kiet T Nguyen
(74) *Attorney, Agent, or Firm*—Arent Fox LLP (57) ABSTRACT

A beam processing system is for causing a particle beam extracted from a beam generating source to pass through a mass analysis magnet device, a mass analysis slit, and a deflection scanner in the order named, thereby irradiating the particle beam onto a processing object. The mass analysis slit is installed between the mass analysis magnet device and the deflection scanner at a position where the particle beam having passed through the mass analysis magnet device converges most in a lateral direction. A first DC quadrupole electromagnet and a second DC quadrupole electromagnet are installed on an upstream side and a downstream side of the mass analysis slit, respectively.

8 Claims, 8 Drawing Sheets

BEAM PROCESSING SYSTEM AND BEAM PROCESSING METHOD

This application is based upon and claims the benefit of priority from Japanese patent application No. 2006-150103, filed on May 30, 2006, the disclosure of which is incorporated herein its entirety by reference.

BACKGROUND OF THE INVENTION

This invention relates to a beam processing system for processing a processing object by irradiating thereto a beam (particle beam) of light, electrons, ions or the like.

Figure 1A:
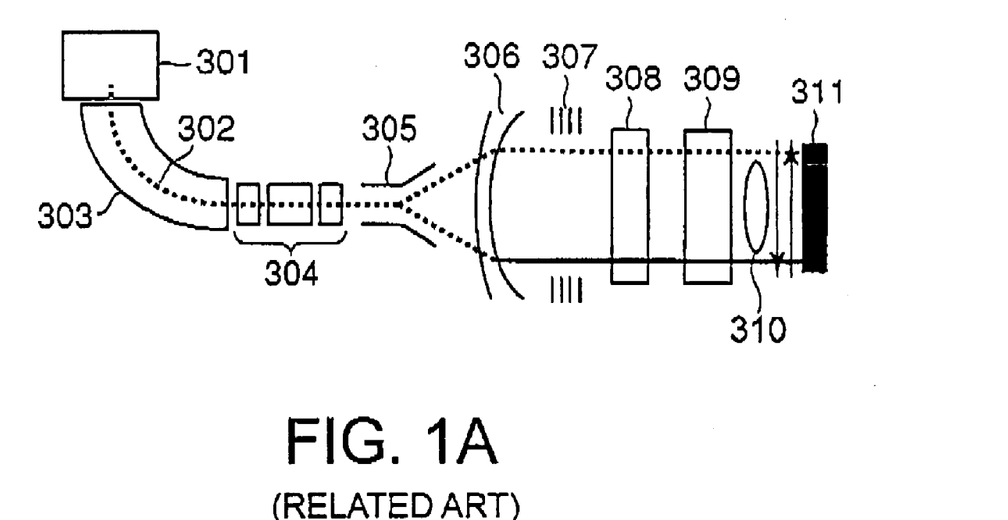
FIGS. 1A and 1B are a plan sectional view (FIG. 1A) and a side sectional view (FIG. 1B) for explaining a schematic structure of a beam scan type ion implantation system in a related art.
Figure 1B:
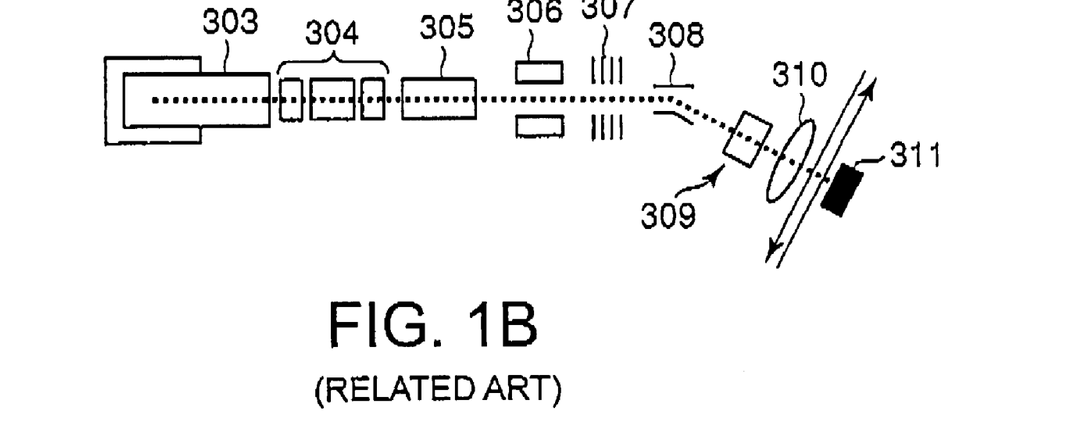

Referring to FIGS. 1A and 1B, a description will be given of an example of an ion implantation system, particularly a beam scan type ion implantation system, among beam processing systems. Such an ion implantation system is disclosed, for example, in Japanese Unexamined Patent Application Publication (JP-A) No. 2003-288857.

In FIGS. 1A and 1B, ions produced in an ion source 301 are extracted as a beam 302 through a non-illustrated extraction electrode. The extracted beam 302 is subjected to a mass analysis in a mass analysis magnet device 303 so that a necessary ion species is selected. The beam 302 composed of the necessary ion species is shaped in cross section by a beam shaper 304. The beam shaper 304 is composed of a Q (Quadrupole)-magnetic pole lens, a Q electrostatic electrode lens, or the like. The beam having the shaped cross section is deflected by a deflection scanner 305 in a direction parallel to the sheet surface of FIG. 1A. Hereinafter, this direction will also be called a "scan direction" or a "lateral direction" and a direction perpendicular to such a direction will also be called a "vertical direction" or a "longitudinal direction".

The deflected beam is parallelized again by a P (Parallel)-lens 306 so as to be parallel to an axis of a deflection angle of 0°. In FIG. 1A, a scan range of the beam by the deflection scanner 305 is indicated by a thick black line and a broken line at the downstreem side of the deflection scanner 305. The beam from the P-lens 306 is transferred to an angular energy filter 308 through one or more acceleration/deceleration electrodes 307. The angular energy filter 308 performs an analysis about energy of the beam to thereby select an ion species with necessary energy. As shown in FIG. 1B, the selected ion species is deflected slightly downward in the angular energy filter 308. The beam composed of the thus selected ion species is irradiated onto a wafer 310 through a plasma electron flood system 309. The beam that is not irradiated onto the wafer 310 is incident on a beam stopper 311 so that energy thereof is consumed. Normally, the structure from the ion source 301 to a vacuum process chamber where the wafer 310 is accommodated is called a beam line.

In this type of ion implantation system, the beam extracted from the ion source 301 performs, after the mass analysis, scanning in the lateral direction at a scanning frequency of several hundreds of Hz to several KHz by the deflection scanner 305 and then is parallelized by the P-lens 306. The longitudinal sectional shape (cross-sectional shape) of the beam is circular and the diameter size thereof is much smaller than the size of the wafer 310, but the beam scan range is set greater than the wafer 310. With respect to the vertical direction, i.e. the longitudinal direction, mechanical scanning is implemented to move the wafer 310. After the parallelization again, the beam is accelerated or decelerated by the acceleration/deceleration electrode or electrodes 307 so as to cover a wide energy range of 5 keV to 260 keV. By performing the energy analysis through the angular energy filter 308 in the form of an electric field or a magnetic field after the acceleration or deceleration, pure ions can be implanted into the wafer 310. Although not illustrated, energy slits are installed on the downstream side of the angular energy filter 308.

In this type of beam scan type ion implantation system, there is a case where the longitudinal sectional shape of a beam is required to be an elliptical or oval shape elongated in the scan direction, i.e. the lateral direction, for ensuring the uniformity of ion implantation into a wafer. In this case, the size of the longitudinal sectional shape is set smaller than the diameter of the wafer with respect to the beam width in the longitudinal direction but is set sufficiently greater than the diameter of the wafer with respect to the beam width in the lateral direction.

SUMMARY OF THE INVENTION

It is an exemplary object of this invention to enable a beam having an elliptical, circular, or oval longitudinal section to be shaped into a beam having an elliptical or oval longitudinal section elongated in a lateral direction so as to enter a deflection scanner.

It is another exemplary object of this invention to enable the longitudinal sectional shape of a beam to be uniform at any irradiation positions on a processing object.

The present invention is applied to a beam processing system for causing a particle beam extracted from a beam generating source to pass through a mass analysis magnet device, a mass analysis slit, and a deflection scanner in the order named, thereby irradiating the particle beam onto a processing object. According to a first exemplaray aspect of this invention, the mass analysis slit is installed between the mass analysis magnet device and the deflection scanner at a position where the particle beam having passed through the mass analysis magnet device converges most in a lateral direction. A first DC quadrupole electromagnet and a second DC quadrupole electromagnet are installed on an upstream side and a downstream side of the mass analysis slit, respectively.

The present invention is also applied to a beam processing system for causing a particle beam extracted from a beam generating source to pass through a mass analysis magnet device, a mass analysis slit, a deflection scanner, a beam parallelizer, and an acceleration/deceleration electrode device in the order named, thereby irradiating the particle beam onto a processing object. According to a second exemplaray aspect of this invention, the mass analysis slit is installed between the mass analysis magnet device and the deflection scanner at a position where the particle beam having passed through the mass analysis magnet device converges most in a lateral direction. A convergence unit for shaping a beam section of the particle beam into an elliptical or oval shape elongated in the lateral direction is installed between the mass analysis slit and the deflection scanner. The particle beam with the beam section having the elliptical or oval shape elongated in the lateral direction is deflected in the lateral direction by the deflection scanner.

The present invention is still applied to a beam processing method of causing a particle beam extracted from a beam generating source to pass through a mass analysis magnet device, a mass analysis slit, a deflection scanner, a beam parallelizer, and an acceleration/deceleration electrode device in the order named, thereby irradiating the particle beam onto a processing object. According to a third exemplaray aspect of this invention, the method comprising causing the particle beam having passed through the mass analysis magnet device to forcibly converge in a longitudinal direction and to diverge in a lateral direction in the vicinity of upstream of the mass analysis slit and causing the particle beam having passed through the mass analysis slit to forcibly converge in the longitudinal direction and to diverge in the lateral direction in the vicinity of upstream of the deflection scanner, thereby irradiating the particle beam strongly converging in the longitudinal direction onto the processing object.

According to the above aspects of the present invention, the following effects are obtained.

1. A beam having an elliptical or oval section elongated in the lateral direction and strongly converging in the longitudinal direction is allowed to enter the deflection scanner, so that it is possible to minimize longitudinal-direction divergence of the beam at a beam irradiation position on a processing object.

2. Even if the distance between the mass analysis magnet device and the deflection scanner is changed, required beam shaping is enabled.

3. Since unnecessary beam cutting and unnecessary beam divergence can be prevented, an increase in beam is enabled even with a low-energy beam.

DESCRIPTION OF THE EXEMPLARY EMBODIMENTS

Figure 2A:
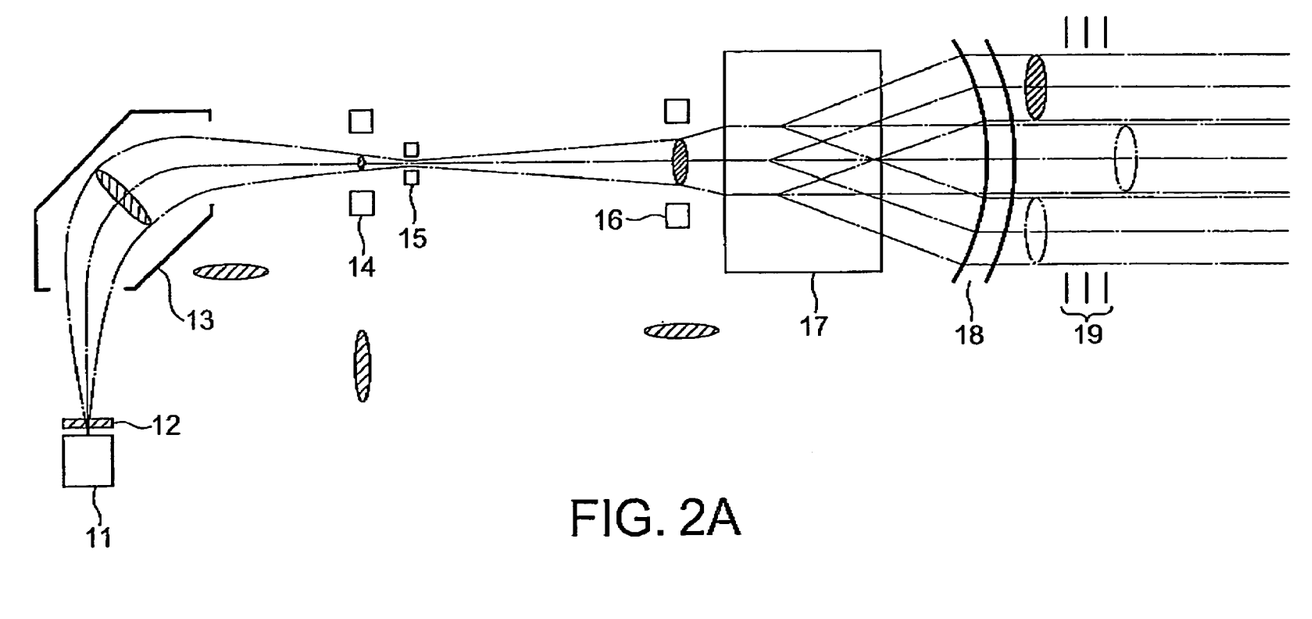
FIGS. 2A and 2B are a plan sectional view (FIG. 2A) and a side sectional view (FIG. 2B) showing the structure of the main portion of an ion implantation system according to an exemplary embodiment of this invention.
Figure 2B:
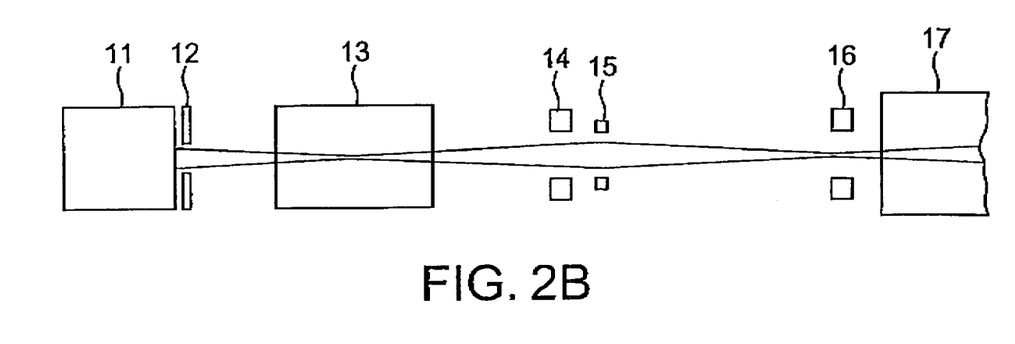

FIGS. 2A and 2B are a plan sectional view (FIG. 2A) and a side sectional view (FIG. 2B) showing the main structure of an exemplary embodiment, wherein this invention is applied particularly to a single-wafer ion implantation system among beam scan type beam processing systems.

In FIGS. 2A and 2B, this ion implantation system comprises an ion beam generating source 11, an extraction electrode 12, a mass analysis magnet device 13, a first DC quadrupole electromagnet 14, a mass analysis slit 15, a second DC quadrupole electromagnet 16, a deflection scanner 17, a beam parallelizer (P-lens) 18, and an acceleration/deceleration electrode device 19 which are installed in the order named. The mass analysis magnet device 13, the deflection scanner 17, the beam parallelizer 18, and the acceleration/deceleration electrode device 19 have the same functions as those explained with reference to FIGS. 1A and 1B, respectively. Although not illustrated in FIGS. 2A and 2B, an angular energy filter is further installed on the downstream side of the acceleration/deceleration electrode device 19 and an ion beam having passed through the angular energy filter is irradiated onto a wafer accomodated in a vacuum process chamber as explained with reference to FIGS. 1A and 1B.

This exemplary embodiment has features in the following configurations.

1. The mass analysis slit 15 is installed between the mass analysis magnet device 13 and the deflection scanner 17.

2. Particularly, the mass analysis slit 15 is installed at a position where an ion beam having passed through the mass analysis magnet device 13 converges most in the lateral direction.

3. The first DC quadrupole electromagnet 14 is an electromagnet device for longitudinal-direction convergence and lateral-direction divergence and is installed between the mass analysis magnet device 13 and the mass analysis slit 15.

4. It is preferable that the first DC quadrupole electromagnet 14 be installed at an optimal portion on the upstream side of the mass analysis slit 15, specifically, at a portion in the vicinity of upstream of the mass analysis slit 15.

5. The second DC quadrupole electromagnet 16 is an electromagnet device for longitudinal-direction convergence and lateral-direction divergence and is installed between the mass analysis slit 15 and the deflection scanner 17.

6. It is preferable that the second DC quadrupole electromagnet 16 be installed at an optimal portion on the downstream side of the mass analysis slit 15, specifically, at a portion in the vicinity of upstream of the deflection scanner 17.

7. The first DC quadrupole electromagnet 14 and the second DC quadrupole electromagnet 16 are preferably controlled independently of each other, but may be controlled otherwise.

Now, a description will be given of the operation of the ion implantation system configured as described above.

Ions generated in the ion beam generating source 11 are extracted as an ion beam through the extraction electrode 12 and the extracted ion beam incidents to the mass analysis magnet device 13. By the function of an extraction slit of the extraction electrode 12, the ion beam is radiated as an ion beam converging in the longitudinal direction and diverging in the lateral direction.

In the mass analysis magnet device 13, the incident ion beam is subjected to a mass analysis so that a necessary ion species is selected. By the foregoing function of the extraction electrode 12, the ion beam entering the mass analysis magnet device 13 converges most in longitudinal-direction beam width and diverges most in lateral-direction beam width at the central position of the mass analysis magnet device 13. However, since the mass analysis magnet device 13 serves also as a so-called convex lens, the ion beam having passed through the central position of the mass analysis magnet device 13 is caused to diverge in beam width in the longitudinal direction and converge in beam width in the lateral direction.

Figure 3:
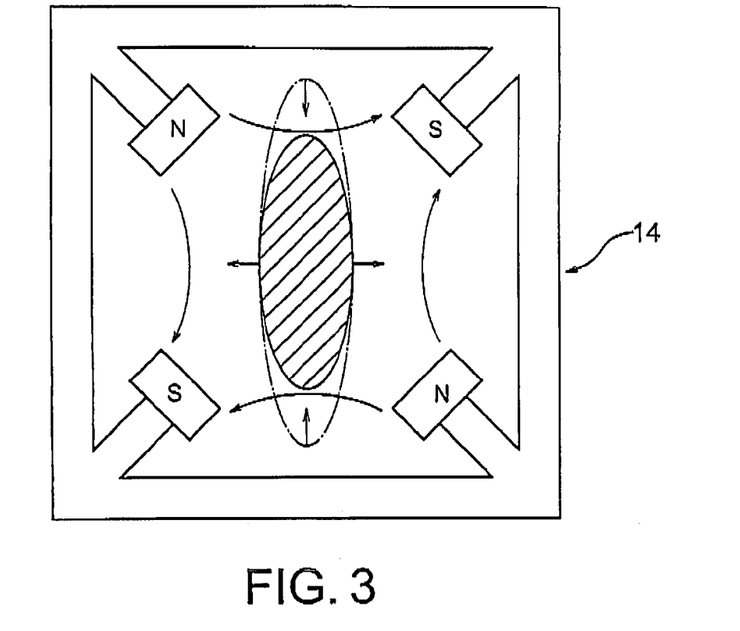
FIG. 3 is a cross-sectional view for explaining the operation of a first DC quadrupole electromagnet shown in FIGS. 2A and 2B.

The first DC quadrupole electromagnet 14 serves to cause the beam width of the ion beam having passed through the mass analysis magnet device 13 to converge in the longitudinal direction and to diverge in the lateral direction. That is, the ion beam having a longitudinal sectional shape with a large longitudinal-direction beam width (diverging in the longitudinal direction) and a small lateral-direction beam width (converging in the lateral direction) enters the first DC quadrupole electromagnet 14 as indicated by an alternate long and short dash line in FIG. 3, and the first DC quadrupole electromagnet 14 serves to cause the beam width of the incident ion beam to converge in the longitudinal direction and to diverge in the lateral direction as indicated by a solid line in FIG. 3. This operation is based on Fleming's left-hand rule. For example, assuming that the ion beam advances from the front side to the back side of the drawing sheet, this is the direction of current and, by an action with a magnetic field around the ion beam, a force depending on the direction of the magnetic field contributes to convergence or divergence of the ion beam. If the first DC quadrupole electromagnet 14 is located at a portion in the vicinity of upstream of the mass analysis slit 15, the ion beam with a greater lateral width is allowed to pass through the mass analysis slit 15. Further, it is also possible to suppress longitudinal-direction divergence and thus the ion beam is allowed to pass in a larger amount with respect to the longitudinal direction. That is, it is possible to prevent unnecessary beam cutting and unnecessary beam divergence.

The ion beam having passed through the mass analysis slit 15 tends to converge in beam width in the longitudinal direction and to diverge in beam width in the lateral direction.

Figure 4:
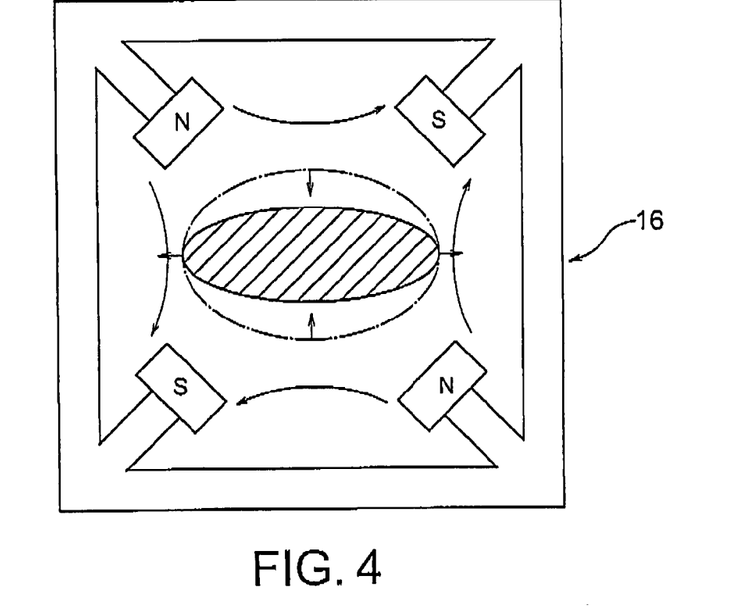
FIG. 4 is a cross-sectional view for explaining the operation of a second DC quadrupole electromagnet shown in FIGS. 2A and 2B.

The second DC quadrupole electromagnet 16 serves to cause the beam width of the ion beam having passed through the mass analysis slit 15 to converge in the longitudinal direction and to diverge in the lateral direction. That is, the ion beam having a longitudinal sectional shape with a relatively large lateral-direction beam width (diverging in the lateral direction) and a small longitudinal-direction beam width (converging in the longitudinal direction) enters the second DC quadrupole electromagnet 16 as indicated by an alternate long and short dash line in FIG. 4, and the second DC quadrupole electromagnet 16 serves to cause the beam width of the incident ion beam to further converge in the longitudinal direction and to diverge in the lateral direction as indicated by a solid line in FIG. 4. As a result, the ion beam again converges most in longitudinal-direction beam width at the position of the second DC quadrupole electromagnet 16. Thus, the ion beam strongly converging in the longitudinal direction and diverging in the lateral direction, i.e. the ion beam having an elliptical or oval longitudinal section elongated in the lateral direction, is transferred to the deflection scanner 17.

For facilitating understanding, the longitudinal sectional shapes of the ion beam at the central position of the mass analysis magnet device 13 and at the first and second DC quadrupole electromagnets 14 and 16 are shown in FIG. 2A near the respective reference numerals.

The deflection scanner 17 performs lateral-direction reciprocating scanning with the thus obtained ion beam having the elliptical or oval longitudinal section elongated in the lateral direction.

The ion beam having passed through the deflection scanner 17 is parallelized again by the beam parallelizer 18 so as to be parallel to an axis of a deflection angle of 0°. The ion beam from the beam parallelizer 18 is transferred to the non-illustrated angular energy filter through the acceleration/deceleration electrode device 19 formed by one or more electrodes. The angular energy filter performs an analysis about energy of the ion beam to thereby select an ion species with necessary energy.

As explained with reference to FIG. 1B, the selected ion species is deflected slightly downward in the angular energy filter. The ion beam composed of the thus selected ion species is irradiated onto a wafer. The ion beam that is not irradiated onto the wafer is incident on a beam stopper so that energy thereof is consumed. Also in this ion implantation system, the wafer is subjected to mechanical scanning in the vertical direction, i.e. the longitudinal direction.

According to the ion implantation system of this exemplary embodiment, the following effects are obtained.

1. An ion beam having an elliptical or oval longitudinal section elongated in the lateral direction and strongly converging in the longitudinal direction is allowed to enter the deflection scanner 17, so that it is possible to minimize longitudinal-direction divergence of the ion beam at an ion implantation position to thereby improve the uniformity of ion implantation.

2. Even if the distance between the mass analysis magnet device 13 and the deflection scanner 17 is changed, required beam shaping is enabled.

3. By installing a plurality of first DC quadrupole electromagnets 14 and a plurality of second DC quadrupole electromagnets 16, an ion beam is allowed to converge in the longitudinal direction and to diverge in the lateral direction a plurality of times between the mass analysis magnet device 13 and the deflection scanner 17.

4. By preventing unnecessary beam cutting and unnecessary beam divergence, it is possible to contribute to an increase in low-energy beam.

On the other hand, in order to improve the uniformity of ion implantation, it is preferable that the longitudinal sectional shape of an ion beam be uniform at any scanning positions on the downstream side of the deflection scanner 17 shown in FIG. 2A, i.e. at any irradiation positions with respect to a wafer. A description will be given hereinbelow of an ion implantation system improved for realizing it.

Referring to FIGS. 5A and 5B to FIGS. 9A to 9C, a description will be given of another exemplary embodiment obtained by improving the foregoing exemplary embodiment. The other exemplary embodiment is applied to the case where a deflection scanner is of the electrostatic deflection type. The electrostatic deflection type deflection scanner is formed by installing two scanning electrodes so as to be opposed to each other with a beam trajectry interposed therebetween.

Figure 5A:
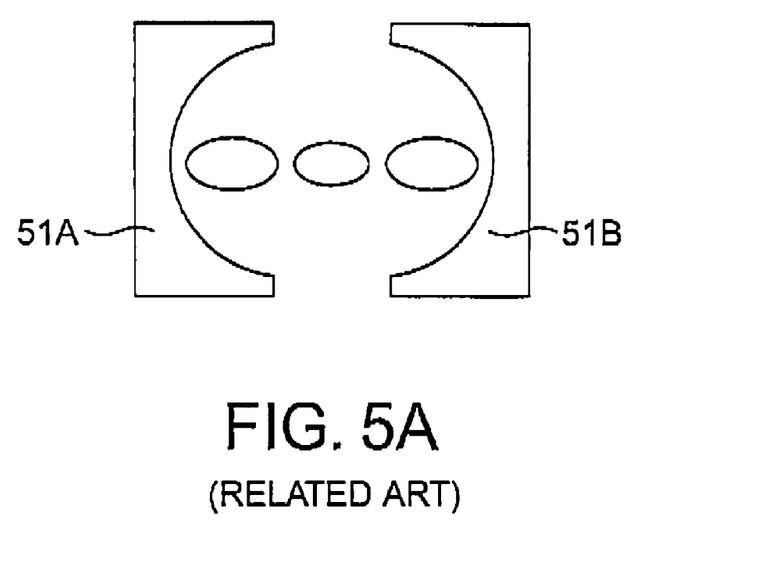
FIGS. 5A and 5B are diagrams for explaining, by comparison, a deflection scanner (FIG. 5A) in a related art and a deflection scanner in another exemplary embodiment of this invention (FIG. 5B), wherein beam longitudinal sectional shapes are shown as seen from the downstream side of the scanners.

When an ion beam scans a scan range with electrostatic deflection, the longitudinal sectional size of the ion beam at end portions of the scan range tends to become larger than that at the central portion of the scan range on the downstream side of the deflection scanner as shown in FIG. 5A. The end portions of the scan range represent end portions near scanning electrodes 51A and 51B in the reciprocating scan range of the ion beam, while the central portion of the scan range represents a portion around the central axis in the reciprocating scan range of the ion beam.

Such a tendency arises because the mass of each of ions contained in the ion beam and that of each of electrons attached to the ion beam largely differ from each other and further because the repulsion force between the ions increases as the beam current density increases.

Figure 6:
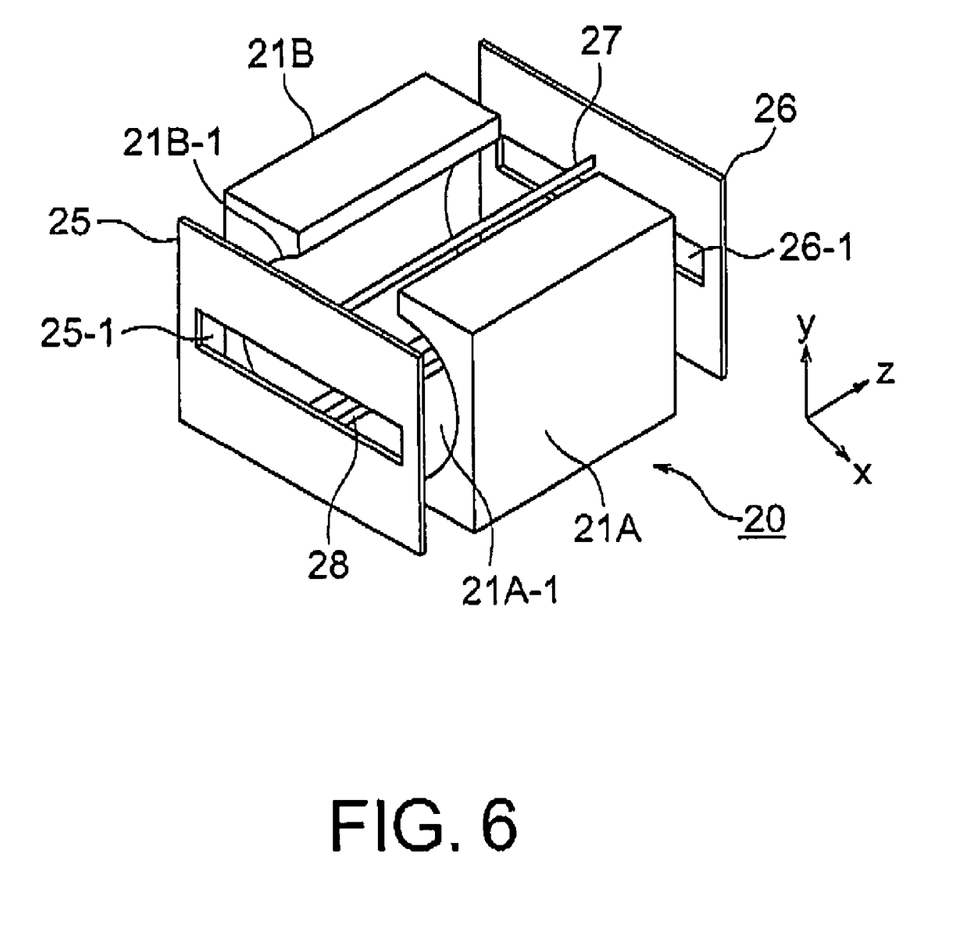
FIG. 6 is a perspective view showing a schematic structure of a deflection scanner used in the other exemplary embodiment of this invention.

FIG. 6 is a perspective view showing the basic structure of the deflection scanner 20 according to another exemplary embodiment of this invention. The deflection scanner 20 comprises a pair of scanning electrodes 21A and 21B installed so as to be opposed to each other with the beam interposed therebetween. The deflection scanner 20 further comprises the electron suppression electrodes 25 and 26 installed near the scanning electrodes 21A and 21B on their upstream and downstream sides, respectively, so as to sandwich the scanning electrodes 21A and 21B therebetween. The deflection scanner 20 still further comprises electric field correction electrodes 27 and 28 for zero electric field effect suppression each connected to the electron suppression electrodes 25 and 26 and installed in a space defined by opposed electrode surfaces of the scanning electrodes 21A and 21B. Herein, the electric field correction electrodes 27 and 28 are set to a negative potential equal to that of the electron suppression electrodes 25 and 26. The electron suppression electrodes 25 and 26 have laterally elongated openings 25-1 and 26-1, respectively, in a beam passing region and are applied with a DC voltage of about −1 to −2 kV The layout shown in FIG. 6 is only one example, i.e. the layout of the scanning electrodes 21A and 21B is not limited to the illustrated manner in which the scanning electrodes 21A and 21B are installed so as to be opposed to each other in the horizontal direction. For example, the scanning electrodes 21A and 21B may be installed so as to be opposed to each other in the vertical direction. Further, the upstream-side (front-side) and downstream-side (rear-side) electron suppression electrodes 25 and 26 do not necessarily have the same shape. For convenience, FIG. 6 shows three-dimensional x-, y-, and z-axes. The x-axis may be regarded as an axis parallel to the reciprocating scan plane of a beam, the y-axis as an axis parallel to the vertical direction, and the z-axis as an axis parallel to a beam advancing axis (the central axis in the reciprocating scan plane).

The scanning electrodes 21A and 21B are symmetrical in shape with respect to the beam advancing axis and are installed so that their surfaces on the beam advancing axis side (opposed electrode surfaces) become symmetrical with respect to the beam advancing axis. On the opposed electrode surfaces of the scanning electrodes 21A and 21B, grooves 21A-1 and 21B-1 each having a substantially circular-arc shape in cross-section are formed so as to each extend in the z-axis direction.

Figure 7A:
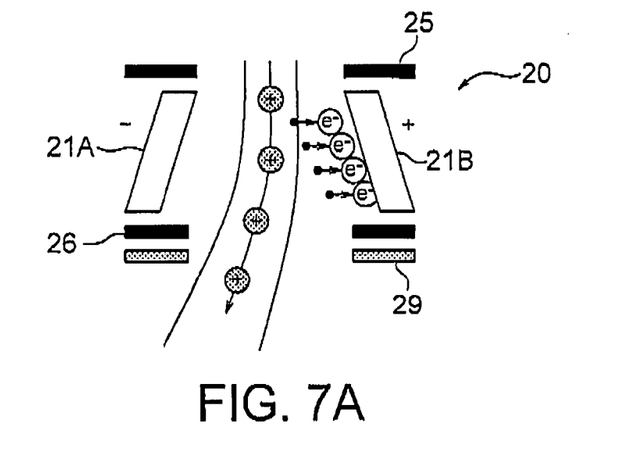
FIGS. 7A to 7C are diagrams for explaining the operation of the deflection scanner in the other exemplary embodiment of this invention.
Figure 7B:
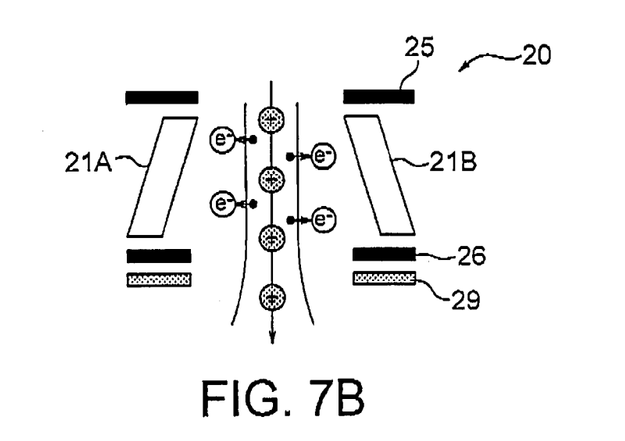
Figure 7C:
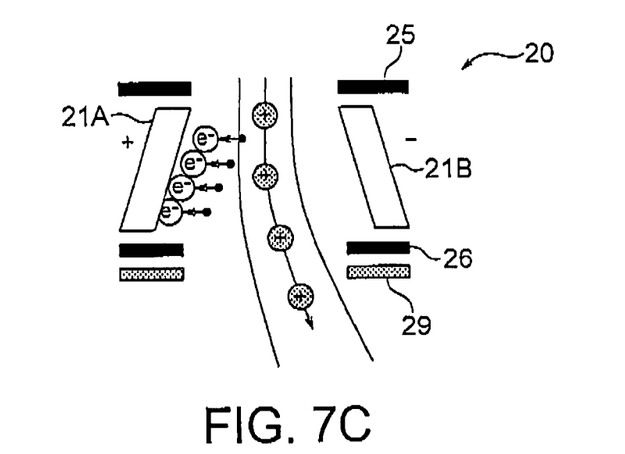
Figure 8:
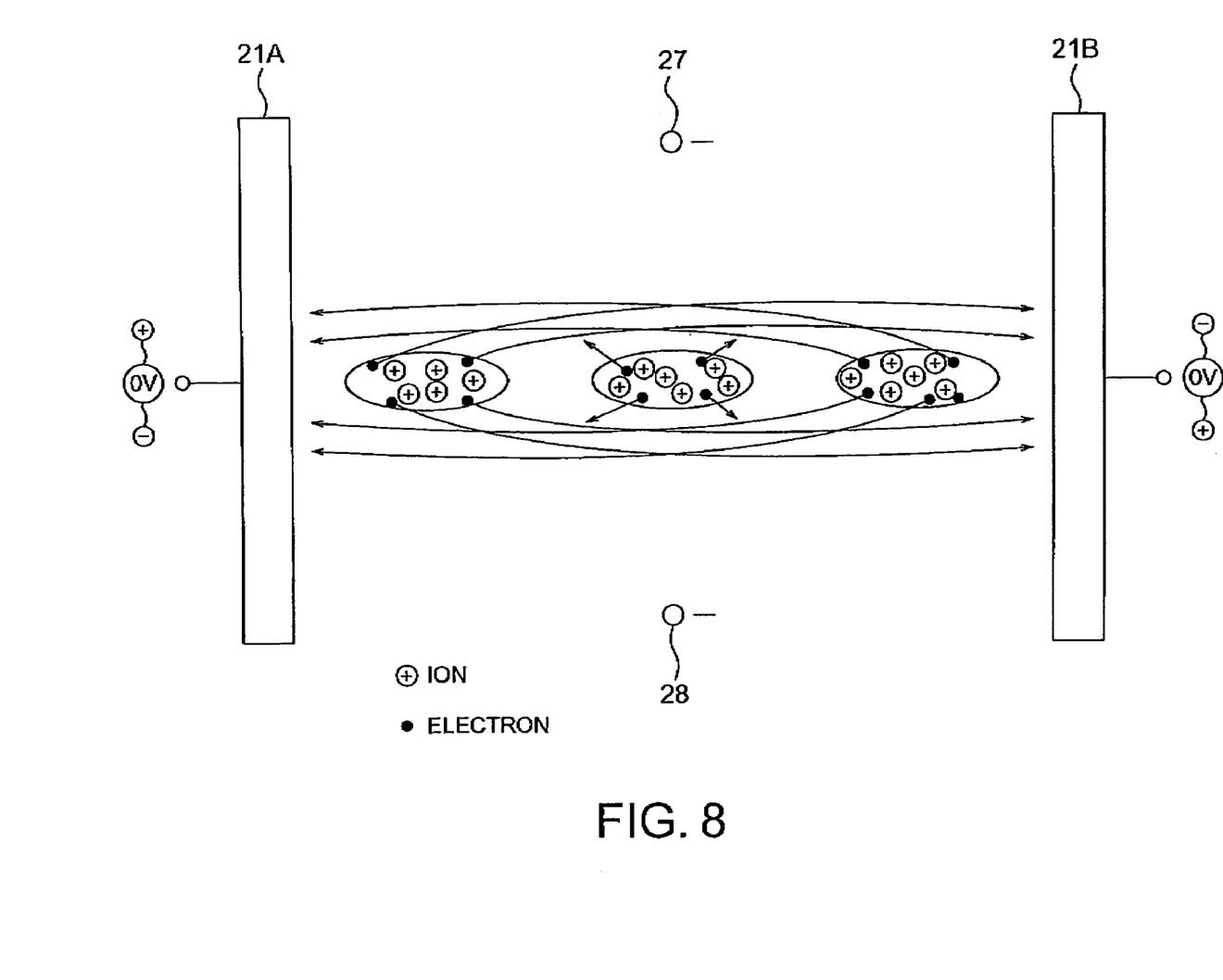
FIG. 8 is a diagram for explaining the operation of electric field correction electrodes in the deflection scanner according to the other exemplary embodiment of this invention.

FIGS. 7A to 7C and FIG. 8 are diagrams for explaining the operation of zero electric field effect suppression by the deflection scanner 20 of this invention. FIGS. 7A to 7C show the deflection scanner 20 in transverse section, wherein illustration of the electric field correction electrodes is omitted. The scanning electrodes 21A and 21B are configured so that the interval between their opposed electrode surfaces gradually increases as advancing toward the downstream side. This is the layout for Increasing a beam scan range. Further, a ground electrode 29 is installed adjacent to the downstream-side electron suppression electrode 26. Naturally, the ground electrode 29 is grounded. On the other hand, FIG. 8 is a diagram, as seen from the downstream side, of the deflection scanner 20. For facilitating explanation, the scanning electrodes 21A and 21B are shown in the form of flat plates parallel to each other. This means that this invention is applicable to any of the following deflection scanners. The first example is a deflection scanner in which a pair of scanning electrodes are in the form of parallel flat plates as shown in FIG. 8. The second example is a deflection scanner in which, as shown in FIGS. 7A to 7C, the interval between a pair of flat plate-shaped scanning electrodes increases as advancing toward the downstream side. The third example is a deflection scanner in which, as shown in FIG. 6, opposed electrode surfaces of a pair scanning electrodes are each formed with a groove extending in the beam advancing axis direction (z-axis direction). The fourth example is a deflection scanner in which the interval between opposed electrode surfaces of a pair of scanning electrodes shown in FIG. 6 increases as advancing toward the downstream side. However, the configuration of the scanning electrodes shown in FIG. 6 is preferable. The reason for this will be described later.

In FIG. 7A, ions with positive charge passing through the deflection scanner 20 are attracted to the left-side scanning electrode 21A having a negative voltage. On the other hand, electrons attached to a beam are attracted to the right-side scanning electrode 21B having a positive voltage. In FIG. 8, this is shown by a beam sectional shape (oval shape) located close to the scanning electrode 21A. Accordingly, the beam passing through the deflection scanner 20 loses the electrons and thus the ions with positive charge repulse each other due to the space-charge effect, so that the beam tends to diverge. Since the mass of an electron is smaller than that of an ion, the deflection angle of the electron is greater than that of the ion.

Also in FIG. 7C, for the same reason as in FIG. 7A, an ion beam passing through the deflection scanner 20 tends to diverge. FIG. 8 shows that, in the case of a beam sectional shape (oval shape) located close to the scanning electrode 21B, electrons attached to the beam are attracted to the left-side scanning electrode 21A having the positive voltage.

On the other hand, FIG. 7B shows the state of a beam at an instant when the voltage applied across the pair of scanning electrodes 21A and 21B electrically connected to an AC scan power supply is just zero. In FIG. 8, this is shown by a beam sectional shape (oval shape) located at a middle portion between the scanning electrodes 21A and 21B. In this case, electrons attached to the beam are not attracted to the scanning electrode 21A or 21B, but are scattered in random directions, not remaining in the beam, due to negative electric fields from the electric field correction electrodes 27 and 28 exerted to the electrons most largely. This suppresses the tendency of the beam to converge due to the remaining electrons.

Figure 5B:
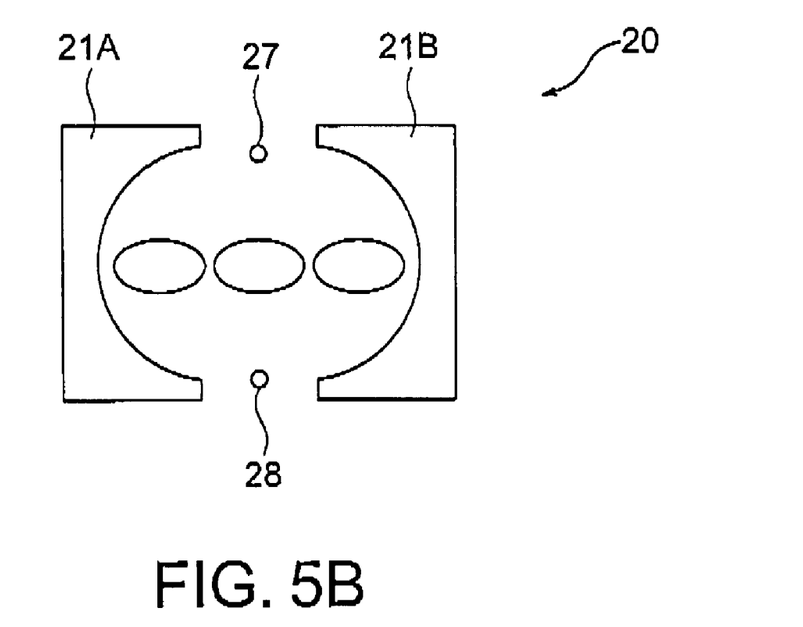

By the operation of the electric field correction electrodes 27 and 28 as described above, the beam diameter does not change at any of end portions and central portion of the scan range on the downstream side of the deflection scanner 20 and thus is constant over the scan range as shown in FIG. 5B.

Figure 9A:
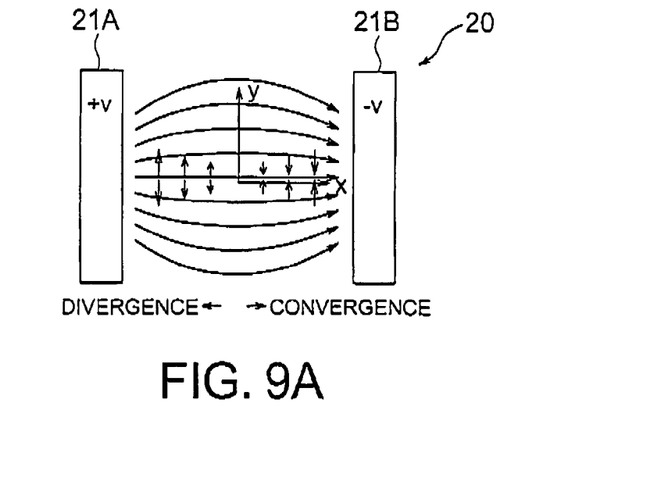
FIGS. 9A to 9C are diagrams for explaining the operations in the case where scanning electrodes of a deflection scanner are each formed with a groove (FIG. 9B) and in the case where scanning electrodes of a deflection scanner are formed with no groove (FIG. 9A).
Figure 9B:
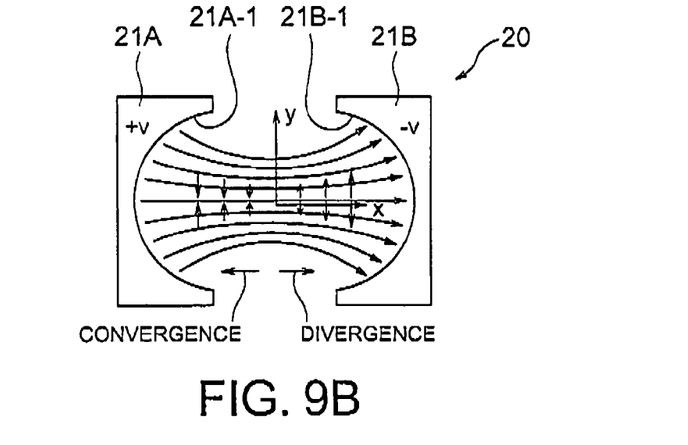
Figure 9C:
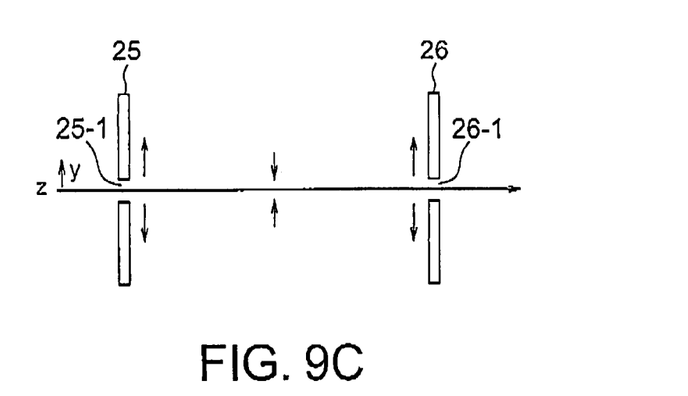

Referring now to FIGS. 9A to 9C, the significance of the grooves 21A-1 and 21B-1 in the scanning electrodes 21A and 21B will be described. These grooves contribute to suppressing vertical convergence/divergence of a beam to a small level before and after passing through the deflection scanner 20.

In a region inside the deflection scanner 20 and not near either of the upstream-side and downstream-side electron suppression electrodes, deflection electric fields produced by the scanning electrodes 21A and 21B become dominant.

Vertical components of the deflection electric fields are determined by the shape of the grooves 21A-1 and 21B-1 of the scanning electrodes 21A and 21B.

When a positive voltage +V is applied to the left-side scanning electrode and a negative voltage −V is applied to the right-side scanning electrode, the electric field distribution becomes as shown in FIG. 9A or 9B depending on the presence/absence and shape of the grooves.

In the case of the scanning electrodes 21A and 21B in the form of the parallel flat plates shown in FIG. 9A, an electric field in the y-axis direction (vertical direction) has the same directivity as that of an electric field at the opening (see FIG. 6) of each electron suppression electrode to thereby amplify the convergence/divergence of a beam in the y-axis direction.

The scanning electrodes 21A and 21B shown in FIG. 9B are formed with the proper grooves 21A-1 and 21B-1, respectively. In this case, as indicated by arrows in FIG. 9C, an electric field in the y-axis direction remote from the suppression electrodes 25 and 26 has a directivity that cancels the electric fields in the y-axis direction near the openings 25-1 and 26-1 of the suppression electrodes 25 and 26. The electric field in the y-axis direction remote from the suppression electrodes 25 and 26 is much weaker as compared with the electric fields near the openings 25-1 and 26-1 of the suppression electrodes 25 and 26, but its acting distance range is long, so that the actions of convergence and divergence become substantially equal to each other over the entire deflection scanner 20.

In the case of the scanning electrodes 21A and 21B shown in FIG. 9B, the shape and size of the grooves 21A-1 and 21B-1 are determined so that the actions of the electric fields near the openings of the suppression electrodes and the electric field in the y-axis direction (vertical direction) between the opposed electrode surfaces of the scanning electrodes 21A and 21B in the region not near the suppression electrodes have substantially the same magnitude to thereby cancel each other. This makes it possible to suppress the vertical convergence/divergence of the beam to a small level before and after passing through the deflection scanner 20.

While this invention has been described in terms of the two exemplaray embodiments, the invention is not to be limited thereto, but may be modified in various manners. For example:

1. The first DC quadrupole electromagnet 14 is omitted and, instead of the second DC quadrupole electromagnet 16, a DC quadrupole electromagnet which is more powerful and larger than the second DC quadrupole electromagnet 16 is installed in the vicinity of upstream of the deflection scanner 17.

2. Two or more first DC quadrupole electromagnets are installed between the mass analysis magnet device 13 and the mass analysis slit 15 and two or more second DC quadrupole electromagnets are installed between the mass analysis slit 15 and the deflection scanner 17.

3. Use is made of another convergence means (e.g. lens electrodes) adapted to shape a beam section into an elliptical or oval shape elongated in the lateral direction.

In the beam processing system according to the present invention, it is preferable that the particle beam is caused to forcibly converge in a longitudinal direction and to diverge in the lateral direction by the first DC quadrupole electromagnet and is caused to forcibly converge in the longitudinal direction and to diverge in the lateral direction by the second DC quadrupole electromagnet, thereby forming a beam strongly converging in the longitudinal direction.

In the beam processing system according to the present invention, it is preferable that the first DC quadrupole electromagnet is installed in the vicinity of upstream of the mass analysis slit and the second DC quadrupole electromagnet is installed in the vicinity of upstream of the deflection scanner, and that the particle beam having passed through the mass analysis magnet device is caused to forcibly converge in the longitudinal direction and to diverge in the lateral direction by the first DC quadrupole electromagnet in the vicinity of upstream of the mass analysis slit and the particle beam having passed through the mass analysis slit is caused to forcibly converge in the longitudinal direction and to diverge in the lateral direction by the second DC quadrupole electromagnet in the vicinity of upstream of the deflection scanner, thereby forming the beam strongly converging in the longitudinal direction.

In the beam processing system according to the present invention, it is preferable that a plurality of first DC quadrupole electromagnets and a plurality of second DC quadrupole electromagnets are installed on the upstream side and the downstream side of the mass analysis slit, respectively, thereby causing the particle beam to converge in the longitudinal direction and to diverge in the lateral direction a plurality of times.

In the beam processing system according to the present invention, it is preferable that the first DC quadrupole electromagnet and the second DC quadrupole electromagnet are controlled independently of each other.

In the beam processing system according to the present invention, it is preferable that the mass analysis slit is installed at the position where the particle beam having a beam section of an elliptical, circular, or oval shape and having passed through the mass analysis magnet device converges most in the lateral direction, and that the particle beam having passed through the mass analysis magnet device is once caused to converge in the longitudinal direction and to diverge in the lateral direction by the first DC quadrupole electromagnet and the particle beam having passed through the mass analysis slit is again caused to converge in the longitudinal direction and to diverge in the lateral direction by the second DC quadrupole electromagnet, thereby shaping the beam section into an elliptical or oval shape elongated in the lateral direction.

In the beam processing system according to the present invention, it is preferable that the deflection scanner is of an electrostatic deflection type comprising a pair of scanning electrodes installed so as to be opposed to each other with a beam trajectry interposed therebetween. In this case, the deflection scanner may further comprises a pair of electric field correction electrodes installed in a direction perpendicular to an opposing direction of the pair of scanning electrodes, with the beam trajectry interposed therebetween, and extending along a beam advancing axis. Positive and negative potentials are alternately applied to the pair of scanning electrodes, while a correction voltage is constantly applied to the pair of electric field correction electrodes. A correction electric field produced by the pair of electric field correction electrodes is exerted on the particle beam passing between the pair of scanning electrodes at the time of switching between the positive and negative potentials.

In the beam processing method according to the present invention, it is preferable that the mass analysis slit is installed at a position where the particle beam having a beam section of an elliptical, circular, or oval shape and having passed through the mass analysis magnet device converges most in the lateral direction. In this case, the particle beam having passed through the mass analysis magnet device is once caused to converge in the longitudinal direction and to diverge in the lateral direction. The particle beam having passed through the mass analysis slit is again caused to converge in the longitudinal direction and to diverge in the lateral direction, thereby shaping the beam section into an elliptical or oval shape elongated in the lateral direction, and the particle beam with the beam section having the elliptical or oval shape elongated in the lateral direction is deflected in the lateral direction by the deflection scanner.

What is claimed is:

1. A beam processing system for causing a particle beam extracted from a beam generating source to pass through a mass analysis magnet device, a mass analysis slit, and a deflection scanner in the order named, thereby irradiating the particle beam onto a processing object, wherein said mass analysis slit is installed between said mass analysis magnet device and said deflection scanner at a position where the particle beam having passed through said mass analysis magnet device converges most in a lateral direction, and a first vertically focusing DC quadrupole electromagnet and a second vertically focusing DC quadrupole electromagnet are installed on an upstream side and a downstream side of said mass analysis slit, respectively, the vertically focusing being for converging the particle beam in a longitudinal direction, wherein said first DC quadrupole electromagnet is installed in the vicinity of upstream of said mass analysis slit, and said second DC quadrupole electromagnet is installed in the vicinity of upstream of said deflection scanner, wherein the particle beam having passed through said mass analysis magnet device is caused to forcibly converge in the longitudinal direction for the first step and to diverge in the lateral direction by said first DC quadrupole electromagnet in the vicinity of upstream of said mass analysis slit, and the particle beam having passed through said mass analysis slit is caused to forcibly converge in the longitudinal direction for the second step and to diverge in the lateral direction by said second DC guadrupole electromagnet in the vicinity of upstream of said deflection scanner, thereby forming the beam strongly doublesteps converging in the longitudinal direction, and wherein said mass analysis slit is installed at the position where the particle beam having a beam section of an elliptical, circular, or oval shape and having passed through said mass analysis magnet device converges most in the lateral direction.

2. The beam processing system according to claim 1, wherein the particle beam is caused to forcibly converge in a longitudinal direction and to diverge in the lateral direction by said first DC quadrupole electromagnet and is caused to forcibly converge in the longitudinal direction and to diverge in the lateral direction by said second DC quadrupole electromagnet, thereby forming a beam strongly converging in the longitudinal direction.

3. The beam processing system according to claim 1, wherein said first DC quadrupole electromagnet and said second DC quadrupole electromagnet are controlled independently of each other.

4. The beam processing system according to claim 1, wherein the particle beam having passed through said mass analysis magnet device is once caused to converge in the longitudinal direction and to diverge in the lateral direction by said first DC quadrupole electromagnet, and the particle beam having passed through said mass analysis slit is again caused to converge in the longitudinal direction and to diverge in the lateral direction by said second DC quadrupole electromagnet, thereby shaping the beam section into an elliptical or oval shape elongated in the lateral direction.

5. A beam processing system for causing a particle beam extracted from a beam generating source to pass through a mass analysis magnet device, a mass analysis slit, a deflection scanner, a beam parallelizer, and an acceleration/deceleration electrode device in the order named, thereby irradiating the particle beam onto a processing object, wherein said mass analysis slit is installed between said mass analysis magnet device and said deflection scanner at a position where the particle beam having passed through said mass analysis magnet device converges most in a lateral direction, vertically convergence means for shaping a beam section of the particle beam into an elliptical or oval shape elongated in the lateral direction is installed between said mass analysis slit and said deflection scanner, and the particle beam with the beam section having the elliptical or oval shape elongated in the lateral direction is deflected in the lateral direction by said deflection scanner.

6. The beam processing system according to claim 5, wherein said deflection scanner is of an electrostatic deflection type comprising a pair of scanning electrodes installed so as to be opposed to each other with a beam trajectory interposed therebetween, said deflection scanner further comprises a pair of electric field correction electrodes installed in a direction perpendicular to an opposing direction of said pair of scanning electrodes, with the beam trajectory interposed therebetween, and extending along a beam advancing axis, positive and negative potentials are alternately applied to said pair of scanning electrodes, while a correction voltage is constantly applied to said pair of electric field correction electrodes, and a correction electric field produced by said pair of electric field correction electrodes is exerted on the particle beam passing between said pair of scanning electrodes at the time of switching between said positive and negative potentials.

7. A beam processing method of causing a particle beam extracted from a beam generating source to pass through a mass analysis magnet device, a mass analysis slit, a deflection scanner, a beam parallelizer, and an acceleration/deceleration electrode device in the order named, thereby irradiating the particle beam onto a processing object, said method comprising:

arranging said mass analysis slit at a position where the particle beam having a beam section of an elliptical, circular, or oval shape and having passed through said mass analysis magnet device converges most in the lateral direction, causing the particle beam having passed through said mass analysis magnet device to forcibly converge in a longitudinal direction and to diverge in a lateral direction in the vicinity of upstream of said mass analysis slit; and causing the particle beam having passed through said mass analysis slit to forcibly converge in the longitudinal direction and to diverge in the lateral direction in the vicinity of upstream of said deflection scanner, thereby irradiating the particle beam strongly converging in the longitudinal direction onto said processing object.

8. The beam processing method according to claim 7, wherein the particle beam having passed through said mass analysis magnet device is once caused to converge in the longitudinal direction and to diverge in the lateral direction, the particle beam having passed through said mass analysis slit is again caused to converge in the longitudinal direction and to diverge in the lateral direction, thereby shaping the beam section into an elliptical or oval shape elongated in the lateral direction, and the particle beam with the beam section having the elliptical or oval shape elongated in the lateral direction is deflected in the lateral direction by said deflection scanner.

* * * * *